United States Patent
Lin

(10) Patent No.: US 6,789,922 B2
(45) Date of Patent: Sep. 14, 2004

(54) CROSS-SHAPED BEAM LASER RAY DEVICE AND LENS

(76) Inventor: Chih-Hsiung Lin, 1F, No. 143, Chun Shaug St., Chung Ho City, Taipei Hsien (TW)

( * ) Notice: Subject to any disclaimer, the term of this patent is extended or adjusted under 35 U.S.C. 154(b) by 56 days.

(21) Appl. No.: 10/142,845

(22) Filed: May 13, 2002

(65) Prior Publication Data

US 2003/0210548 A1 Nov. 13, 2003

(51) Int. Cl.$^7$ .................................................. F21V 5/00
(52) U.S. Cl. ..................... 362/259; 362/202; 362/332; 362/336; 362/338
(58) Field of Search ................................ 362/259, 202, 362/332, 336, 337, 338, 339, 331, 335; 359/708, 710, 719, 668, 718, 626, 624

(56) References Cited

U.S. PATENT DOCUMENTS

| | | | |
|---|---|---|---|
| 3,655,192 A | * | 4/1972 | Hall et al. ..................... 463/51 |
| 5,042,048 A | * | 8/1991 | Meyer .......................... 372/108 |
| 5,523,889 A | * | 6/1996 | Bewsher ....................... 359/710 |
| 5,743,633 A | * | 4/1998 | Chau et al. ................... 362/331 |
| 6,000,813 A | * | 12/1999 | Krietzman ................... 362/259 |
| 6,062,702 A | * | 5/2000 | Krietzman ................... 362/158 |
| 6,144,787 A | * | 11/2000 | Johnston et al. .............. 385/31 |
| 6,657,788 B2 | * | 12/2003 | Tacklind et al. ............. 359/618 |

* cited by examiner

Primary Examiner—Thomas M. Sember
(74) Attorney, Agent, or Firm—Troxell Law Office PLLC

(57) ABSTRACT

A cross-shaped beam laser ray device having a housing containing a battery, a laser diode driver circuit, a laser diode, and a convex lens. A transverse columnar faceted lens, respectively, with a cap having an aperture through its center is fastened to the front extremity of the housing. The transverse columnar faceted lens is aligned vertically with the laser rays such that afer laser rays are emitted by the laser diode and converged through the convex tens, the transverse columnar faceted lens refracts them into a cross-shaped beam that is projected through the aperture and appears as cross hairs when directed onto the surface of a targeted object.

10 Claims, 4 Drawing Sheets

CROSS-SHAPED BEAM LASER RAY DEVICE AND LENS

BACKGROUND OF THE INVENTION

1) Field of the Invention

The invention herein relates to laser pointers, specifically a laser ray device and lens capable of refracting laser rays into a cross-shaped beam.

2) Description of the Related Art

Due to the maturation of light-emitting semiconductor laser technology in recent years as well as the gradually lowered prices of such components, light-emitting semiconductor products have become widespread. One example is the laser pointer, which is commonly utilized for lectures, presenting reports, teaching, and other similar applications because they are easy to carry and convenient to use. Referring to FIG. 1, a conventional laser pointer is comprised of a battery 2, a laser diode driver circuit 3, a laser diode 4, and a convex lens 5 contained in a housing 1. After laser rays emitted by the laser diode 4 pass through the convex lens 5, the parallel light beams have a diameter of approximately 2 mm to 5 mm. The said beams appear as a single spot when directed onto a screen or object. Another type of laser pointer is such that after the laser rays penetrate the convex lens, the refraction of a columnar faceted lens produces a line-like indicating beam. Yet another variety of laser pointer utilizes two laser modules to generate a cross-shaped beam, thereby providing for the direct determination of horizontal and vertical lines during construction or renovation. However, the said laser pointer has a higher production cost because it utilizes two laser modules and numerous components and, furthermore, assembly is extremely time consuming in that correction is required following assembly.

SUMMARY OF THE INVENTION

The inventor of the invention herein developed a laser ray lens capable of projecting a cross-shaped beam that is simpler than the laser module structure approach of generating a cross-shaped beam.

The primary objective of the invention herein is to provide a laser ray lens capable of refracting laser rays into a cross-shaped beam that is easy to fabricate and, furthermore, a simplified laser ray device structure capable of generating a cross-shaped beam to thereby reduce production cost.

DETAILED DESCRIPTION OF THE INVENTION

Figure 1:
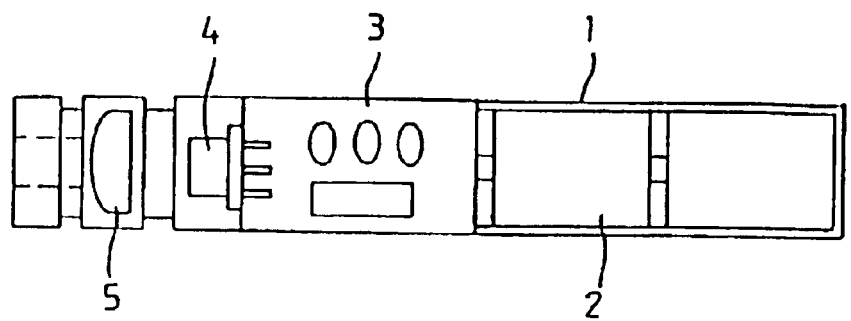
FIG. 1 is a drawing of a conventional laser pointer.
Figure 2:
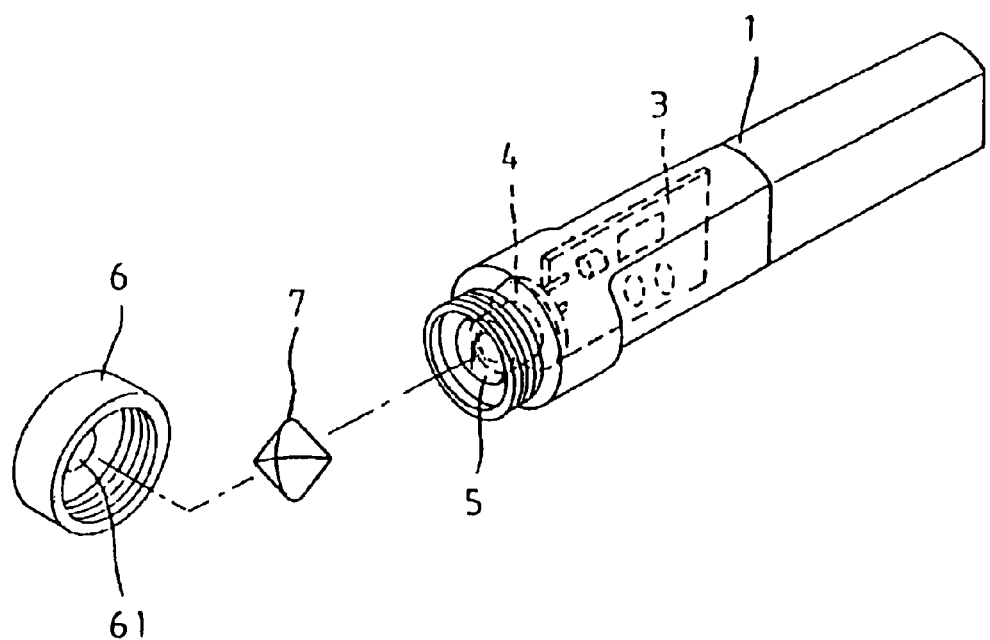
FIG. 2 is an exploded drawing of the laser ray device of the invention herein.
Figure 3:
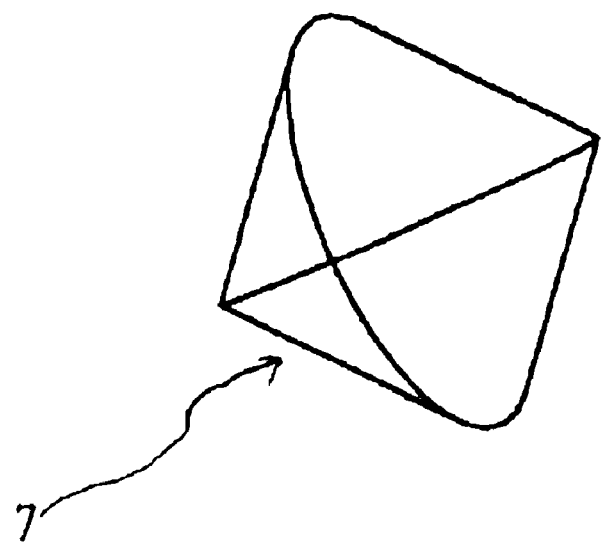
FIG. 3 is an isometric drawing of the transverse columnar faceted lens of the invention herein.
Figure 4:
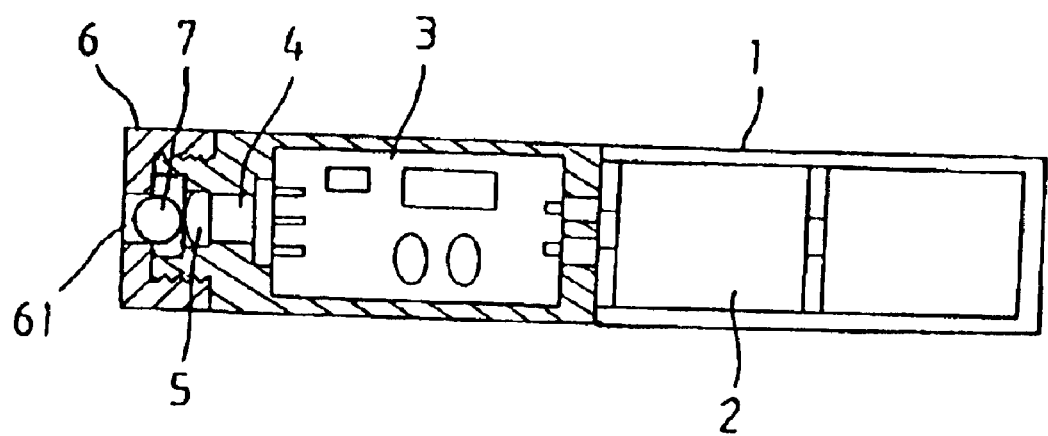
FIG. 4 is a cross-sectional drawing of the laser ray device structure of the invention herein.

Referring to FIG. 2, FIG. 3, and FIG. 4, the laser ray device of the invention herein is comprised of a housing 1 containing a battery 2, a laser diode driver circuit 3, a laser diode 4, and a convex lens 5, respectively, with a cap 6 having an aperture 61 through its center fastened to the front extremity of the said housing 1. A transverse columnar faceted lens 7 fabricated of a transparent material is disposed between the said convex lens 5 and cap 6 and, furthermore, the said transverse columnar faceted lens 7 is aligned vertically with laser rays emitted by the laser diode 4 that are converged and collimated through the convex lens 5.

Figure 5:
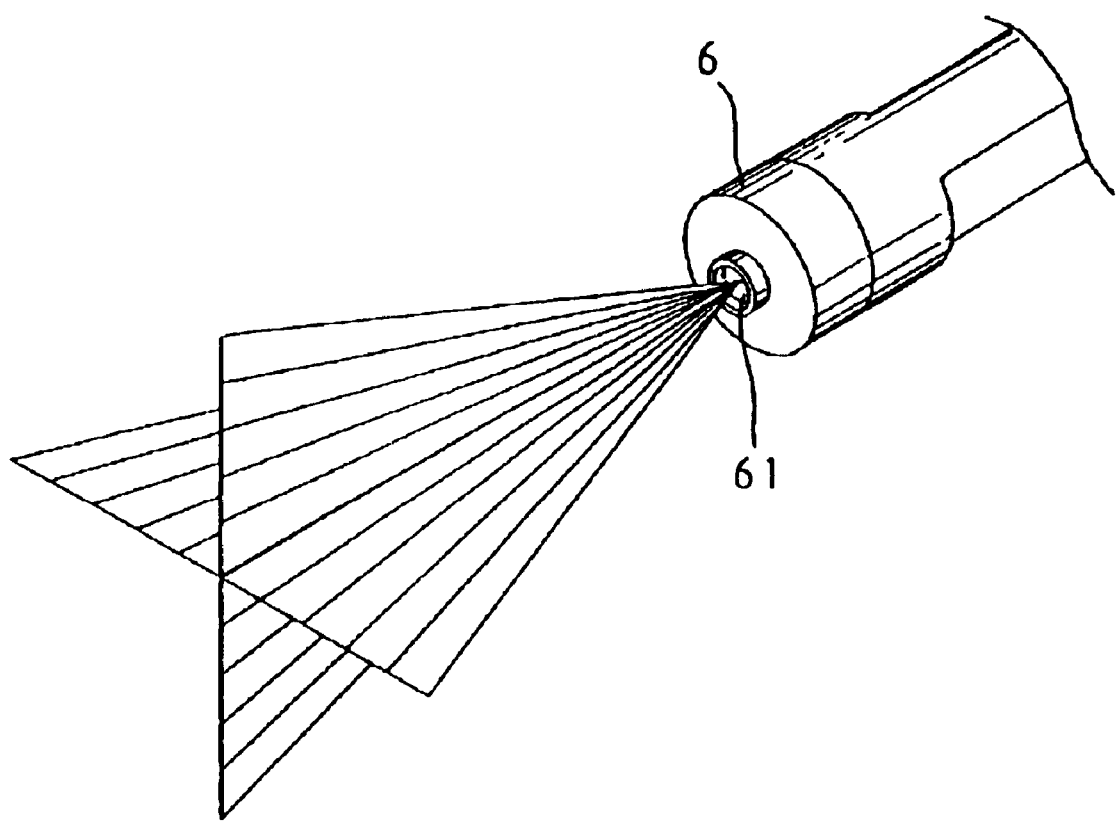
FIG. 5 is an isometric drawing of the laser ray device of the invention herein during usage.

Referring to FIG. 4 and FIG. 5, following convergence through the convex lens 5, the laser rays emitted by the laser diode 4 of the invention are refracted by the said transverse columnar faceted lens 7 into a cross-shaped beam that is projected through the said aperture 61 (as shown in FIG. 5). The said cross-shaped beam appears as cross hairs when directed onto the surface of a targeted object.

Figure 6:
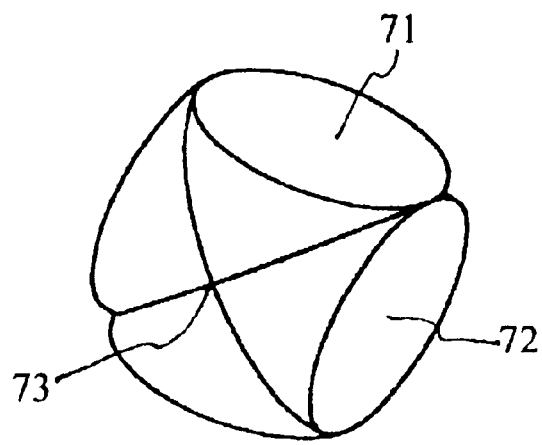
FIG. 6 is an isometric drawing of the laser ray lens of the invention herein before shaping.

The laser ray lens of the invention herein is a transverse columnar faceted lens 7, as indicated in FIG. 3. Referring to FIG. 6, the transverse columnar faceted lens 7 is originally a blank consisting of two equal diameter circular faces 71 and 72 in a perpendicularly confluent (intersected) arrangement, with the profile of the said blank facilitating the grinding of the transverse columnar faceted lens 7 into final shape, as indicated in FIG. 3. When laser rays are emitted onto the top 73 of the said confluence, the refraction of the circular faces 71 and 72 produces a cross-shaped beam; the cross pattern is formed due to the angular merging of the said circular faces 71 and 72.

Figure 7:
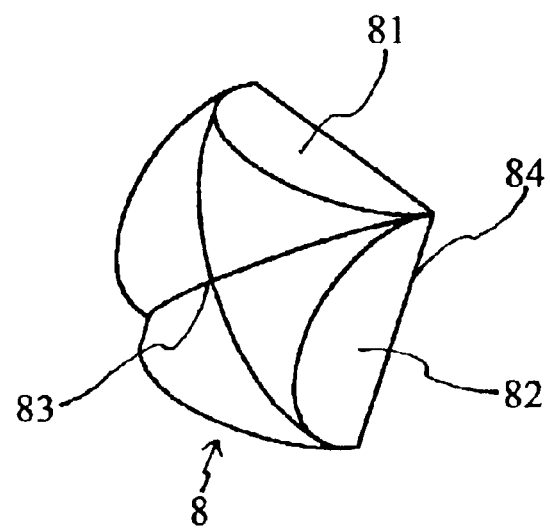
FIG. 7 is an isometric drawing of another laser ray lens embodiment of the invention herein before shaping.

Referring to FIG. 7, another embodiment of the transverse columnar faceted lens 8 blank consists of two equal diameter semicircular faces 81 and 82 in a confluent (intersected) arrangement. When laser rays are emitted onto the top 83 of the said confluence, the refraction of the semicircular faces 81 and 82 produces a cross-shaped beam. Moreover, the said transverse columnar faceted lens 8 has a flat face 84 that facilitates finishing and attachment to other lenses.

The said special design of the invention herein possesses the following features:

(1) The unique profile of the transverse columnar faceted lens 7 enables the refraction of laser rays into a cross-shaped beam of light and, furthermore, the said profile facilitates shaping and fabrication.

(2) Since the transverse columnar faceted lens 8 consisting of two semicircular faces 81 and 82 in a confluent arrangement has a flat face 84, finishing and attachment to other lenses is facilitated.

(3) Utilizing the transverse columnar faceted lens for the laser ray device does not require two laser modules which simplifies the structure and eases assembly, while involving no post-assembly correction, thereby effectively reducing production cost.

Although the most preferred embodiment of the invention herein has been disclosed above, it shall not be construed as a limitation of the scope of the invention herein and, furthermore, adaptations and embellishments by persons skilled in the technology do not relinquish the spirit and claims of the present invention. In other words, all modifications and embellishments shall remain protected within the patent claims of the invention herein as delineated by the patent application claims of the present invention.

What is claimed is:

1. A cross-shaped beam laser ray device comprising:
   at least one housing containing a battery, a laser diode driver circuit, a laser diode, and a convex lens, and a transverse columnar faceted lens that is fabricated of a transparent material, respectively, the features of which are that the said transverse columnar faceted lens consists of two equal diameter circular faces in a confluent arrangement such that after laser rays are emitted by the laser diode and converged through the convex lens, the transverse columnar faceted lens refracts them into a cross-shaped beam that appears as cross hairs when directed onto the surface of a targeted object.

2. A cross-shaped beam laser ray device as claimed in claim 1, wherein the two equal diameter circular faces in a confluent arrangement are both semicircular faces.

3. A cross-shaped beam laser ray device as claimed in claim 2, wherein the two semicircular faces are in a perpendicularly confluent arrangement.

4. A cross-shaped beam laser ray device as claimed in claim 1, wherein the two circular faces are in a perpendicularly confluent arrangement.

5. A cross-shaped beam laser ray device as claimed in claim 1 wherein the at least one housing has fastened to its front extremity a cap with an aperture aligned with the transverse columnar faceted lens.

6. Across-shaped beam laser ray device comprising: a transverse columnar faceted lens fabricated of a transparent material consisting of two equal diameter circular faces in a confluent arrangement such that after laser rays emitted by a laser diode are converged through a convex lens, said transverse columnar faceted lens refracts them Into a cross-shaped beam.

7. A cross-shaped beam laser ray device as claimed in claim 6, wherein the two equal diameter circular faces in a confluent arrangement are both semicircular faces.

8. A cross-shaped beam laser ray device as claimed in claim 6, wherein the two circular faces are in a perpendicularly confluent arrangement.

9. A cross-shaped beam laser ray device as claimed in claim 6, wherein the two semicircular circular faces are in a perpendicularly confluent arrangement.

10. A cross-shaped beam laser ray device as claimed in claim 6, wherein the transverse columnar faceted lens is fabricated from a material selected from the group consisting of glass, crystal, and acrylic transparent material.

* * * * *